United States Patent
Gai et al.

(10) Patent No.: US 8,963,160 B2
(45) Date of Patent: Feb. 24, 2015

(54) THIN FILM TRANSISTOR ARRAY SUBSTRATE, MANUFACTURING METHOD THEREOF AND DISPLAY DEVICE

(71) Applicant: BOE Technology Group Co., Ltd., Beijing (CN)

(72) Inventors: Cuili Gai, Beijing (CN); Zhuo Zhang, Beijing (CN)

(73) Assignee: BOE Technology Group Co., Ltd, Beijing (CN)

( * ) Notice: Subject to any disclaimer, the term of this patent is extended or adjusted under 35 U.S.C. 154(b) by 0 days.

(21) Appl. No.: 13/994,080

(22) PCT Filed: Dec. 23, 2012

(86) PCT No.: PCT/CN2012/087232
§ 371 (c)(1),
(2) Date: Jun. 13, 2013

(87) PCT Pub. No.: WO2013/139158
PCT Pub. Date: Sep. 26, 2013

(65) Prior Publication Data
US 2014/0077301 A1    Mar. 20, 2014

(30) Foreign Application Priority Data
Mar. 20, 2012  (CN) .......................... 2012 1 0074046

(51) Int. Cl.
*H01L 27/12*     (2006.01)
*G02F 1/1362*    (2006.01)
*H01L 27/02*     (2006.01)

(52) U.S. Cl.
CPC .......... *H01L 27/124* (2013.01); *H01L 27/1259* (2013.01); *G02F 1/1362* (2013.01); *H01L 27/0288* (2013.01)
USPC ............................................. 257/72; 438/149

(58) Field of Classification Search
CPC ................................................... H01L 27/1259
See application file for complete search history.

(56) References Cited

U.S. PATENT DOCUMENTS 5,283,677 A * 2/1994 Sagawa et al. ................ 349/150
2007/0103827 A1   5/2007 Chang
(Continued)

FOREIGN PATENT DOCUMENTS

| CN | 1963600 A | 5/2007 |
| CN | 101093297 A | 12/2007 |

(Continued)

OTHER PUBLICATIONS

International Search Report (Chinese language) issued by the International Searching Authority, rendered Dec. 23, 2012, 14 pages.
(Continued)

*Primary Examiner* — Stephen W Smoot

(57) ABSTRACT

Embodiments of the present invention disclose a thin film transistor array substrate, a manufacturing method thereof, and a display device. The thin film transistor array substrate comprises: an active pixel region and a wiring region, in which a conductive electrode is formed within the wiring region and the conductive electrode is grounded. The manufacturing method comprises: a thin film transistor array is formed within an active pixel region of a substrate; and a conductive electrode is formed within a wiring region located at the periphery of the active pixel region.

12 Claims, 2 Drawing Sheets

(56) References Cited

U.S. PATENT DOCUMENTS

| | | | |
|---|---|---|---|
| 2008/0158453 | A1 | 7/2008 | Segawa et al. |
| 2008/0204619 | A1 | 8/2008 | Saitou et al. |
| 2014/0077301 | A1 | 3/2014 | GAI et al. |

FOREIGN PATENT DOCUMENTS

| | | |
|---|---|---|
| CN | 101211051 A | 7/2008 |
| CN | 101251695 A | 8/2008 |
| CN | 102655148 A | 9/2012 |

OTHER PUBLICATIONS

The State Intellectual Property Office of the People's Republic of China ("SIPO") (Chinese Language) Office Action issued on Jan. 27, 2014 by SIPO in Chinese Patent Application No. 201210074046.9; four (4) pages.

English Translation of the State Intellectual Property Office of the People's Republic of China ("SIPO") Office Action issued on Jan. 27, 2014 by SIPO in Chinese Patent Application No. 201210074046.9; three (3) pages.

English abstract of CN102655148(A) listed above, 10 pages, Sep. 2012.

English abstract of CN101211051(A) listed above, 19 pages, Jul. 2008.

English abstract of CN101093297(A) listed above, 10 pages, Dec. 2007.

English abstract of CN1963600(A) listed above, 9 pages, May 2007.

English Abstract of CN 101251695A, Listed Above, 1 page, Aug. 2008.

Office Action (Chinese Language) Issued by SIPO on Sep. 9, 2014, 4 pages.

English Translation of Chinese Language Office Action, (Listed Above), 4 pages, Sep. 2014.

PCT International Preliminary Report on Patentability (English Language), Issued by International Bureau of WIPO on Sep. 23, 2014, 12 pages.

\* cited by examiner

THIN FILM TRANSISTOR ARRAY SUBSTRATE, MANUFACTURING METHOD THEREOF AND DISPLAY DEVICE

CROSS REFERENCE TO RELATED APPLICATIONS

This application is based on International Application No. PCT/CN2012/087232 filed on Dec. 23, 2012, which claims priority to Chinese Application No. 201210074046.9 filed on Mar. 20, 2012, the contents of which are incorporated herein by reference.

FIELD OF THE INVENTION

Embodiments of the present invention relate to a thin film transistor (TFT) array substrate, a manufacturing method thereof and a display device.

BACKGROUND OF THE INVENTION

An active display device, regardless of its type (for example, a liquid crystal display, an electronic-paper display, etc.), needs to use an active matrix driving technology. For example, TFT technology is one of the technologies used for implementing an active matrix. An electronic-paper display is usually formed with a thin film transistor array substrate and an electronic-paper substrate which are cell-assembled. The thin film transistor array substrate is responsible for inputting data signals to control the image display, and is composed of an active pixel region and a wiring region at the periphery of the active pixel region. The active pixel region (display region) is composed of a plurality of active pixel units arranged in a matrix form. Each pixel unit is a rectangular region formed by a gate line and a data line crossing each other; within each pixel unit, there are provided a TFT and a pixel electrode. The gate electrode and the source electrode of each TFT are connected with the gate line and the data line, respectively; the data line and the scan line are led to the wiring region, and connected with a data-line driver IC and a scan-line driver IC, respectively. The data-line driver IC and the scan-line driver IC are then connected with an external flexible printed circuit (FPC), and the FPC provides voltages to the gate electrode and the source electrode of the TFT. As shown in FIG. 1, a thin film transistor array substrate of a conventional electronic-paper display device comprises: an active pixel region 1, and a wiring region 2. The wiring region 2 comprises: a data-line-and-scan-line driver IC bonding area 202, a data-line-and-scan-line fan-out area 203, an interconnection area 204 between the driver IC and the external FPC, and an FPC bonding area 205; among them, the driver IC bonding area 202 is used for placing a driver IC.

In the manufacturing process of an active display device, after the manufacture of a thin film transistor array substrate is completed, the thin film transistor array substrate is exposed in the air all the time till a module-assembly stage before the manufacture of the display is completed. At this stage, due to rubbing, static electricity having a voltage up to several kV is often generated, and conducted to the interior of the panel, creating an instantaneous high-intensity electric current, which will cause an irreparable damage to the panel.

SUMMARY OF THE INVENTION

An embodiment of the present invention provides a thin film transistor array substrate, comprising: an active pixel region and a wiring region, wherein a conductive electrode is formed within the wiring region and the conductive electrode is grounded.

Another embodiment of the present invention provides a manufacturing method of a thin film transistor array substrate, and the method comprises: forming a thin film transistor array within an active pixel region of a substrate; and forming a conductive electrode within a wiring region located at the periphery of the active pixel region.

The thin film transistor array substrate, the manufacturing method thereof, the liquid crystal display device, and the electronic-paper display device, which are all provided by the present invention, can discharge the high-voltage static electricity generated in the thin film transistor array substrate at the module-assembly manufacturing stage, without increasing the manufacturing costs, and thus enhances the product reliability.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A thin film transistor array substrate according to an embodiment of the present invention, comprises: an active pixel region and a wiring region. A conductive electrode is formed within the wiring region and the conductive electrode is grounded, so that the high-voltage static electricity generated in the thin film transistor array substrate in the manufacturing process of an active device can be discharged through the conductive electrode, thereby enhancing the product reliability. The conductive electrode is formed in a region, where there is no pixel electrode pattern, within a part or the entire of the wiring region.

In the thin film transistor array substrate of the present invention, the conductive electrode and the pixel electrode may be in a same layer. The conductive electrode and the pixel electrode may be made of a same material (e.g., indium tin oxide (ITO)) in a same preparation process, in order to save costs. Alternatively, the conductive electrode may be formed in a preparation process different from that for the pixel electrode. Alternatively, the conductive electrode may be formed of a material different from the pixel electrode after the formation of the pixel electrode, and formed in a region, where there is no pixel electrode pattern, within a part or the entire of the wiring region.

In one embodiment, within the wiring region, the conductive electrode is formed above a data-line-and-scan-line fan-out area, a driver IC bonding area and an interconnection area. Therefore, it can more effectively discharge the high-voltage static electricity generated in the thin film transistor array substrate at the module-assembly manufacturing stage.

Figure 2:
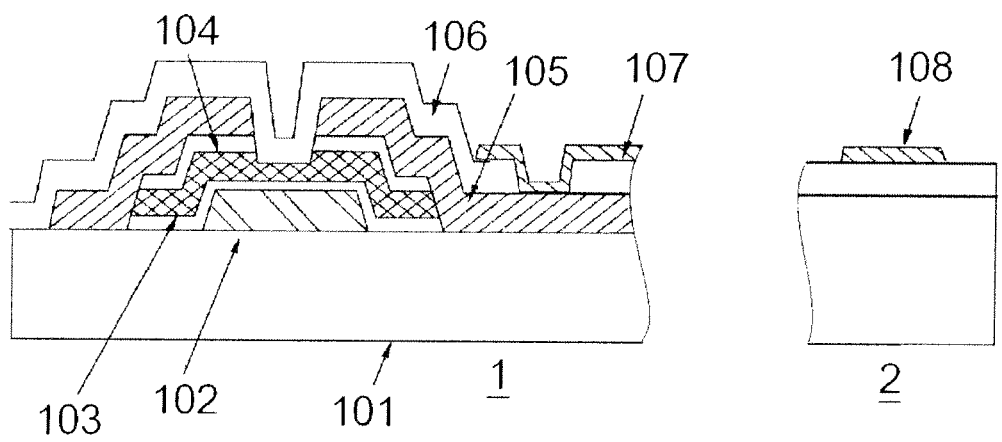
FIG. 2 is a schematic sectional view of a TFT array substrate, prepared by a manufacturing method of a thin film transistor array substrate according to an embodiment of the present invention.

The present invention further provides a manufacturing method of a thin film transistor array substrate described above, and the method adopts a conventional preparation procedure for a thin film transistor array substrate, such as a 4MASK or 5MASK procedure, etc., for the steps before the step of the preparation of a conductive electrode. With a 5MASK procedure as an example, a thin film transistor array substrate prepared is as shown in FIG. 2, in which each layer is subjected to several processing steps, for example, depositing by sputtering or a PECVD (Plasma Enhanced Chemical Vapor Deposition) method, applying with photoresist, exposing, developing, etching, and removing the photoresist. FIG. 2 is a sectional view illustrating parts of an active pixel region 1 and a wiring region 2 of an array substrate. For clarity of illustration, in the wiring region 2, a conductive electrode 108 is mainly shown. However, the manufacture of the array substrate according to the embodiment of the present invention is not limited to the above-mentioned specific processing steps. For example, the method may comprise the steps as follows:

S1. On a substrate (e.g. a glass substrate) 101, a gate metal (e.g., Mo) layer 102 is deposited by sputtering, then pattern including both a gate electrode and a storage capacitor are formed by using a mask;

S2. On the substrate obtained in Step S1, a first insulating layer 103, an active layer and a doped layer 104 are respectively deposited by using a PECVD (Plasma Enhanced Chemical Vapor Deposition) method, then a pattern of an active layer is formed by using a mask;

S3. A source-drain metal (e.g., Mo) layer is deposited by sputtering, then a source-drain pattern 105 is formed by using a mask;

S4. A passivation layer 106 is formed, and a via hole is formed in the passivation layer; for example, the via hole is a connection path between a drain electrode and a pixel electrode formed later.

S5. Indium tin oxide (ITO) is deposited by sputtering, then a pixel electrode pattern is formed by using a pixel electrode mask; the pixel electrode pattern constitutes a pixel electrode 107, and constitutes a conductive electrode 108 within a part or the entire of the wiring region. Alternatively:

The Step S5 is as follows:
ITO is deposited by sputtering, then a pixel electrode pattern is formed by using a pixel electrode mask, and thus a pixel electrode 107 is formed; then, a conductive electrode layer 108 is deposited in a region, where there is no pixel electrode pattern, within a part or the entire of the wiring region, and the material of the conductive electrode 108 may be the same as the pixel electrode 107, for example ITO, also may be different from that of the pixel electrode 107.

An embodiment of the present invention further provides an active device comprising a thin film transistor array substrate described above, and the active device may be of any type, such as a liquid crystal display device, an organic light emitting display (OLED) or an electronic-paper display device, etc.

The embodiment will be explained with an electronic-paper display device as an example.

An electronic-paper display device is formed with a thin film transistor array substrate and an electronic-paper substrate which are cell-assembled; the electronic-paper substrate comprises sequentially: a cover, a common electrode layer, and an electronic-ink material layer configured between the common electrode layer and the thin film transistor array substrate. Except the thin film transistor array substrate, the components described above as well as those not mentioned that are necessary to constitute the electronic-paper display device, will not be specifically described here, and should not be limiting to the present invention.

Figure 1:
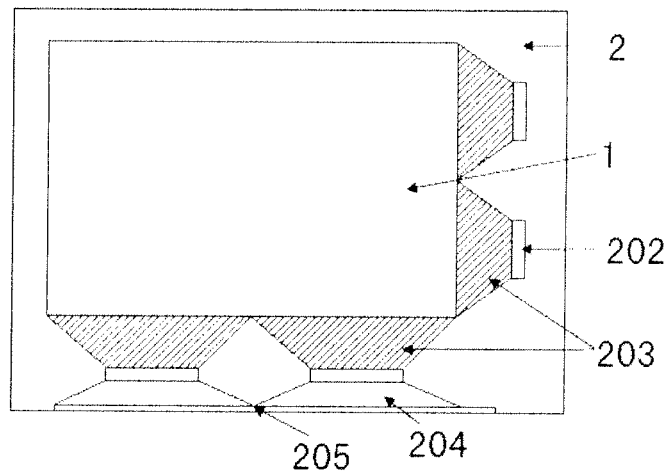
FIG. 1 is a schematic structural view of a thin film transistor array substrate of a conventional electronic-paper display device.
Figure 3:
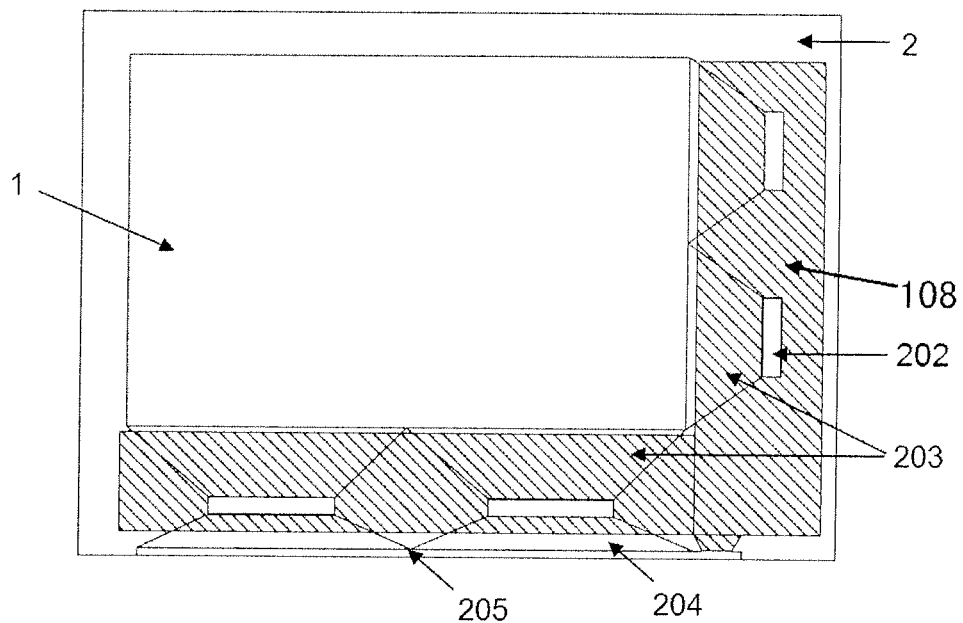
FIG. 3 is a schematic structural view of a thin film transistor array substrate of an electronic-paper display device in accordance with an embodiment of the present invention.

FIG. 3 shows a schematic structural diagram of an array substrate according to the embodiment of the invention. For ease of explanation, the same components as those in FIG. 1 use the same reference numerals. In addition, for simplicity of explanation, in the active pixel region 1 in FIG. 3, illustrations of thin film transistor, data line, scan line, as well as pixel electrode are omitted. As shown in FIG. 3, the thin film transistor array substrate of the electronic-paper display device according to this embodiment having further features comparing with the thin film transistor array substrate shown in FIG. 1: a conductive electrode 108 is formed in a region, where there is no pixel electrode, within a part of the wiring region 2, and a ground terminal is provided in the FPC bonding area 205, and the conductive electrode 108 is connected to the ground terminal. As to other features of the array substrate of the electronic-paper display device, reference may be made to the above detailed description of the array substrate according to the embodiment of the invention, which is not omitted here.

In the embodiment of the invention, the conductive electrode 108 may be separated from the data-line-and-scan-line fan-out area, the driver IC bonding area and the interconnection area, by an insulating layer. Generally, the pixel electrode 107 in the pixel region is separated from certain conductive components (such as a common electrode), by an insulating layer such as a passivation layer. In the case that the conductive electrode 108 and the pixel electrode 107 are formed in a same layer (or formed simultaneously), by virtue of an extension part of the insulating layer, which extends into the wiring region, the conductive electrode 108 may also be separated from the data-line-and-scan-line fan-out area, the driver IC bonding area and the interconnection area, in order not to affect their normal work. However, the embodiments of the invention are not limited to the above structures; for example, the conductive electrode 108 can be formed independent of the pixel electrode 107, while the insulating layer within the wiring region for isolation can also be formed independent of the insulating layer within the pixel region, such as a passivation layer; this is not particularly limited in the present invention.

Certainly, in the case that the conductive electrode 108 is grounded through the ground terminal of the flexible printed circuit bonding area, a lead wire is required to be left within the flexible printed circuit region and used for the conductive electrode 108, so that the conductive electrode 108 is grounded through the flexible printed circuit. The form of the connection between the conductive electrode 108 and the ground terminal is not particularly limited in the embodiments of the invention, which can adopt a variety of suitable connection forms, and the description thereof is omitted here.

The embodiments of the present invention can at least provided the structures and methods as follows:

(1) A thin film transistor array substrate, comprising: an active pixel region and a wiring region,
wherein a conductive electrode is formed within the wiring region, and the conductive electrode is grounded.

(2) The thin film transistor array substrate according to (1), wherein the wiring region further comprises a flexible printed circuit bonding area therein, and the flexible printed circuit bonding area is provided with a ground terminal therein, and the conductive electrode is connected with the ground terminal.

(3) The thin film transistor array substrate according to (1) or (2), wherein the conductive electrode is formed in a region, where there is no pixel electrode pattern, within a part or the entire of the wiring region.

(4) The thin film transistor array substrate according to any one of (1)-(3), wherein a pixel electrode is formed within the active pixel region, and the conductive electrode and the pixel electrode are formed in a same layer.

(5) The thin film transistor array substrate according to any one of (1)-(4), wherein the conductive electrode is an indium tin oxide electrode.

(6) The thin film transistor array substrate according to any one of (1)-(5), wherein the wiring region is at the periphery of the active pixel region.

(7) The thin film transistor array substrate according to any one of (2)-(6), further comprising: a data line and a scan line within the active pixel region, and a data-line-and-scan-line fan-out area, a driver IC bonding area and an interconnection area within the wiring region,
wherein the data line and the scan line within the active pixel region are connected with the data-line-and-scan-line fan-out area within the wiring region, the data-line-and-scan-line fan-out area is connected with the driver IC, and the driver IC is connected to the flexible printed circuit bonding area via the interconnection area.

(8) The thin film transistor array substrate according to (7), wherein, within the wiring region, the conductive electrode is formed above the data-line-and-scan-line fan-out area, the driver IC bonding area and the interconnection area.

(9) A manufacturing method of a thin film transistor array substrate, comprising:
forming a thin film transistor array within an active pixel region of a substrate; and
forming a conductive electrode within a wiring region located at the periphery of the active pixel region.

(10) The manufacturing method of a thin film transistor array substrate according to (9), further comprising: forming a pixel electrode within the active pixel region by patterning a pixel electrode thin film formed on the substrate.

(11) The manufacturing method of a thin film transistor array substrate according to (10), wherein the conductive electrode formed within the wiring region is simultaneously formed with the pixel electrode by patterning the pixel electrode thin film.

(12) The manufacturing method of a thin film transistor array substrate according to (10), wherein the conductive electrode is formed of a material different from that of the pixel electrode.

(13) The manufacturing method of a thin film transistor array substrate according to any one of (9)-(12), further comprising: before the formation of the conductive electrode, a data-line-and-scan-line fan-out area, a driver IC bonding area and an interconnection area are formed within the wiring region, wherein the conductive electrode is formed above the data-line-and-scan-line fan-out area, the driver IC bonding area and the interconnection area.

(14) A display device, comprising a thin film transistor array substrate according to any one of (1)-(8).

(15) The display device according to (14), wherein the display device is a liquid crystal display or an electronic-paper display.

The above are merely exemplary implementations of the present invention, but not for limiting the scope of the invention; instead, the scope of the invention should be defined by the appended claims.

What is claimed is:

1. A thin film transistor array substrate, comprising: an active pixel region and a wiring region,
wherein a conductive electrode is formed within the wiring region, and the conductive electrode is grounded, and
wherein a pixel electrode is formed within the active pixel region, and the conductive electrode and the pixel electrode are formed in a same layer.

2. The thin film transistor array substrate according to claim 1, wherein the wiring region further comprises a flexible printed circuit bonding area therein, and the flexible printed circuit bonding area is provided with a ground terminal therein, and the conductive electrode is connected with the ground terminal.

3. The thin film transistor array substrate according to claim 2, further comprising: a data line and a scan line within the active pixel region, and a data-line-and-scan-line fan-out area, a driver IC bonding area and an interconnection area within the wiring region,
wherein the data line and the scan line within the active pixel region are connected with the data-line-and-scan-line fan-out area within the wiring region, the data-line-and-scan-line fan-out area is connected with the driver IC, and the driver IC is connected to the flexible printed circuit bonding area via the interconnection area.

4. The thin film transistor array substrate according to claim 3, wherein, within the wiring region, the conductive electrode is formed above the data-line-and-scan-line fan-out area, the driver IC bonding area and the interconnection area.

5. The thin film transistor array substrate according to claim 1, wherein the conductive electrode is formed in a region, where there is no pixel electrode pattern, within a part of or the entire of the wiring region.

6. The thin film transistor array substrate according to claim 1, wherein the conductive electrode is an indium tin oxide electrode.

7. The thin film transistor array substrate according to claim 1, wherein the wiring region is at the periphery of the active pixel region.

8. A display device, comprising a thin film transistor array substrate according to claim 1.

9. The display device according to claim 8, wherein the display device is a liquid crystal display or an electronic-paper display.

10. A manufacturing method of a thin film transistor array substrate, comprising:
forming a thin film transistor array within an active pixel region of a substrate; and
forming a conductive electrode within a wiring region located at a periphery of the active pixel region;
forming a pixel electrode within the active pixel region by patterning a pixel electrode thin film formed on the substrate;
wherein the conductive electrode formed within the wiring region is simultaneously formed with the pixel electrode by patterning the pixel electrode thin film.

11. The manufacturing method of a thin film transistor array substrate according to claim 10, wherein the conductive electrode is formed of a material different from that of the pixel electrode.

12. The manufacturing method of a thin film transistor array substrate according to claim 10, further comprising: before the formation of the conductive electrode, a data-line-and-scan-line fan-out area, a driver IC bonding area and an interconnection area are formed within the wiring region, wherein the conductive electrode is formed above the data-line-and-scan-line fan-out area, the driver IC bonding area and the interconnection area.

\* \* \* \* \*